United States Patent [19]

Bachmann et al.

[11] 4,081,290

[45] Mar. 28, 1978

[54] SOLAR CELLS AND PHOTOVOLTAIC DEVICES OF INP/CDS

[75] Inventors: Klaus Jürgen Bachmann, Piscataway; Ernest Buehler, Chatham; Joseph Leo Shay, Marlboro; Sigurd Wagner, Holmdel, all of N.J.

[73] Assignee: Bell Telephone Laboratories, Incorporated, Murray Hill, N.J.

[21] Appl. No.: 672,878

[22] Filed: Apr. 2, 1976

Related U.S. Application Data

[63] Continuation-in-part of Ser. No. 522,060, Nov. 8, 1974, abandoned.

[51] Int. Cl.$^2$ ............................................. H01L 31/06
[52] U.S. Cl. ........................... 136/89 TF; 136/89 CD; 357/16; 357/30; 357/59
[58] Field of Search ...................... 136/89; 357/16, 30, 357/17, 59; 250/211 J; 148/174, 175

[56] References Cited

U.S. PATENT DOCUMENTS

| | | | |
|---|---|---|---|
| 2,759,861 | 8/1956 | Collins et al. | 148/1.5 |
| 2,929,859 | 3/1960 | Loferski | 136/89 |
| 3,433,677 | 3/1969 | Robinson | 136/89 |
| 3,793,069 | 2/1974 | Shimizu | 117/201 |
| 3,902,920 | 9/1975 | Jordan et al. | 136/89 |

OTHER PUBLICATIONS

B. L. Sharma et al., "Semiconductor Heterojunctions", Pergamon Press (1974), pp. 59, 134.
R. C. Clarke et al., "The Preparation of High Purity Epitaxial InP", *Solid State Communications*, vol. 8, pp. 1125-1128 (1970).
M. C. Hales et al., "Epitaxial InP and InAs$_{1-x}$P$_x$", *Symposium on GaAs* (1970), pp. 50-56.
A. G. Milnes et al., "Optical Properties of Heterojunctions and Heterojunction Lasers", *Heterojunctions & Metal Semiconductors*, (1972), pp. 115-122, Academic Press.
*Conference Record*, 10th *IEEE Photovoltaic Specialists Conf.*, Nov. 1973, pp. 1-4, 223, 77-84.
*Japan J. Appl. Phys.*, vol. 13 (1974), pp. 547-548, 1353-1361.
A. Yoshikawa et al., "Growth & Properties of CdS Epitaxial Layers by the Close-Spaced Technique", *J. Appl. Phys.*, vol. 45, pp. 3523-3529, (1974).
*Japan J. Appl. Phys.*, vol. 14, (1975), pp. 1547-1554.
A. Fahrenbuch et al., "II-VI Photovoltaic Heterojunctions for Solar Energy Conversion", *Appl. Phys. Lett.*, vol. 25, (1974), pp. 605-608.
D. Bonnet et al., "New Results On the Development of a Thin Film p-CdTe-n-CdS Heterojunction Solar Cell", 9th *IEEE*, Photovoltaic Specialists Conference, pp. 129-132, (1972).
K. Ito et al., "Preparation & Electrical Properties of Vapor Grown InP and In$_{1-x}$Ga$_x$P Epitaxial Layers" Elect. Eng. In Japan, vol. 94, (1974), pp. 18-24.
K. Ito et al., "nCdS-pInP Heterojunctions", Shin-etsu Meeting of IECE, Japan, Oct. 1974.
H. Hovel, "Semiconductors & Semimetals-vol. 11-Solar Cells", Academic Press, N.Y. (1975), p. 197.
K. Ito et al., "Photovoltaic Effect at n-CdS-pInP Heterojunctions", *Japan J. Appl. Phys.*, vol. 14, pp. 1259-1260, (1975).
A. K. Sreedhar et al., "Efficiency Calculations for Some p-n and n-p Heterojunctions," *Phys. Stat. Sol.*, vol. 3, pp. k217-K221, (1970).

*Primary Examiner*—John H. Mack
*Assistant Examiner*—Aaron Weisstuch
*Attorney, Agent, or Firm*—Bruce S. Schneider

[57] ABSTRACT

Heterodiodes showing excellent potential for use in solar cells and photoelectric devices consist of junctions of p-type indium phosphide and n-type cadmium sulfide. These heterojunctions can be formed either from single crystal or from polycrystalline semiconductor material. The former type junction when incorporated in a solar cell exhibits promise for applications such as in space vehicles. The latter type junction as used in a solar cell has potential for large scale power generation. A chemical vapor deposition process for producing polycrystalline p-type indium phosphide films for incorporation into such a power producing device is disclosed.

29 Claims, 4 Drawing Figures

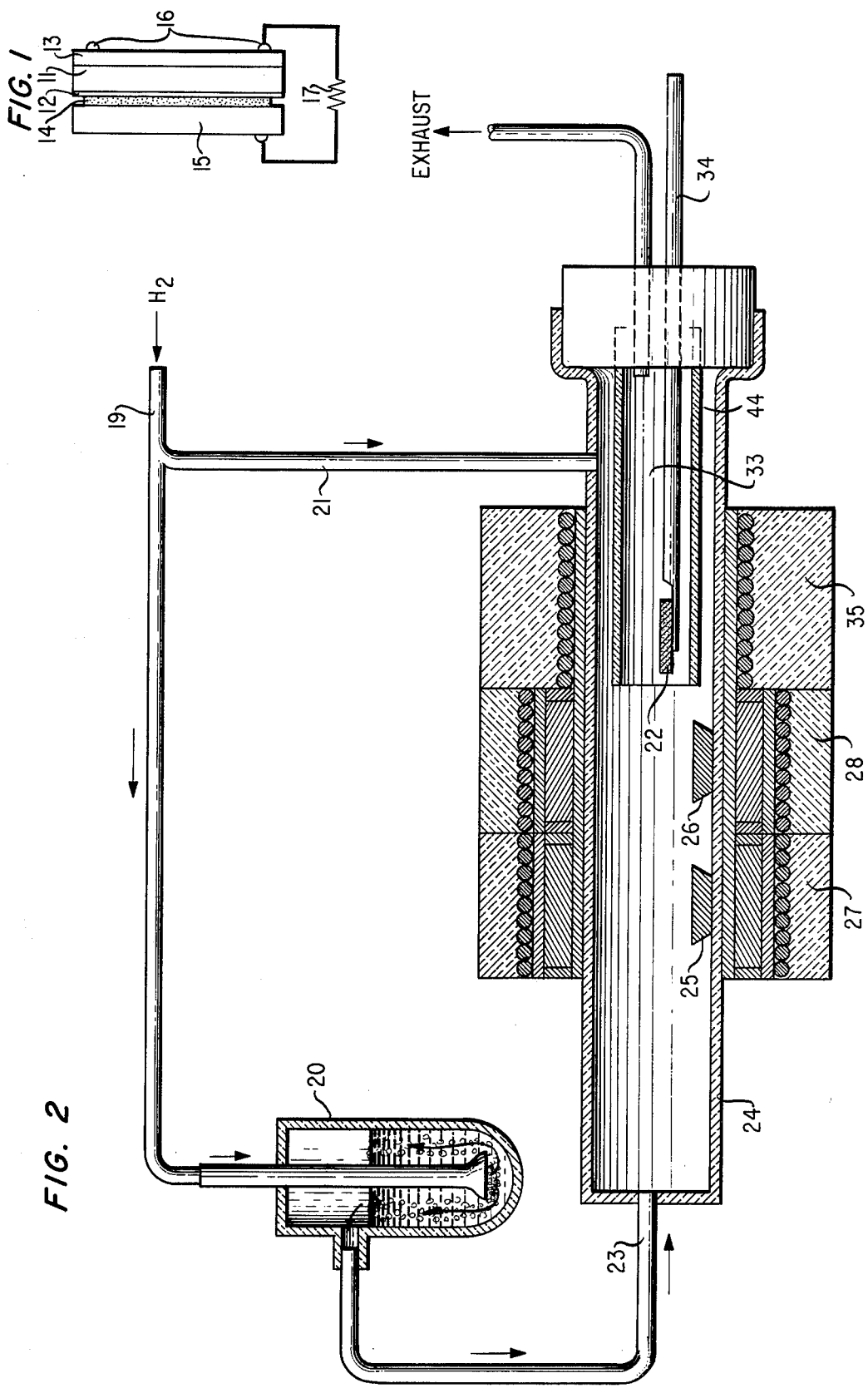

SOLAR CELLS AND PHOTOVOLTAIC DEVICES OF INP/CDS

CROSS REFERENCE TO RELATED APPLICATIONS

This application is a continuation-in-part of our co-pending application, Ser. No. 522,060, filed Nov. 8, 1974 now abandoned which is hereby incorporated by reference.

BACKGROUND OF THE INVENTION

In an attempt to obtain better photovoltaic cells, heterojunction devices have been investigated. Nevertheless many heterojunction devices exhibit various problems including those associated with the interface of two different materials, e.g., lack of adhesion.

The $Cu_xS$/CdS cell, which has received the greatest amount of development work for terrestrial application, exhibits up to 3.7% lattice constant mismatch (See Tseng and Greenfield, *Physica Status Solidi,* 26, 643–656 (1974)) which is expected to cause large interface defect densities. Additionally, the $Cu_xS$/CdS cell has other potential difficulties. For example, copper sulfide is unstable in an atmosphere containing oxygen or water. The multiphase character of copper sulfide presents additional difficulties. Between 450° C and room temperature copper sulfide displays multiple phase changes. This property makes production of defect free crystals more difficult. Indeed it seems possible that heat from solar radiation itself could cause local deformities where the solar light has been focused on the cell.

Other heterojunctions have also been experimented with but no particular heterodiode has shown clear superiority.

SUMMARY OF THE INVENTION

Heterojunctions showing promise for the ultimate construction of efficient single crystal or polycrystalline photovoltaic devices are formed by the junction of p-type indium phosphide (InP) and n-type cadmium sulfide (CdS). Cells, thus formed, lead to junctions which are stable in the presence of oxygen and water and which have useful qualities either for efficient single crystal devices or for thin film polycrystalline devices.

It is an aspect of the invention that the interface between InP and CdS has excellent adhesion —whether these semiconductor materials are single crystal or polycrystalline. Further, the interface of heterodiodes made from p-type InP and n-type CdS have good electrical properties; the ohmic resistance of the semiconductor layers is low and no interfering interfacial energy states are detectable.

A contemplated theory is that the advantageous adhesive and electrical properties of the interface may result from a good match between InP and CdS crystal lattices. InP has a zinc blende crystal structure with lattice parameter, $A_z$, equal to 5.869A. As discussed by Reeber and Kulp, *Trans. Metallurgical Soc.,* 233, 698–702 (1965), CdS has a wurzite hexagonal crystal structure with lattice parameters $A_w = 4.14A$ (and $C_w = 6.72A$). These lattice parameters in themselves are not close, and would seem to indicate that problems due to lattice mismatch might occur. However, no such problems have been observed. It is believed that because both InP and CdS crystals are formed by tetrahedral type bonding and because the tetrahedral radii between InP and CdS in their respective crystal structures are extremely close, the In and S, and the P and Cd moieties can align at the interface. (As calculated from Phillip's tetrahedral radii In - P = 2.533A and Cd - S = 2.53A). This is true of both single crystal and polycrystal junctions.

The advantageous properties of a CdS/InP heterojunction can be achieved in not one but many different configurations of a photovoltaic device. This permits greater flexibility in adapting the heterojunction to the specific use contemplated for such cell or detector. Thus, the invention has even further potential as a primary power source and also as an efficient, compact source.

Examples of devices of single crystal p-InP/n-CdS heterodiode solar cells without antireflection coatings have been made with a uniform quantum efficiency of 70% in the spectral region of 550 to 910 nm and solar energy conversion efficiencies of between 8.5 and 10.3%. Exemplary devices of polycrystalline solar cells with quantum efficiency of 70% and solar energy conversion efficiency of 2.5% have been made.

Implicit in the use of polycrystalline photovoltaic cells and their resulting advantageous characteristics, is the need for an efficient method of making polycrystalline layers of doped indium phosphide. Although such manufacture can be accomplished through a variety of techniques, e.g., conventional evaporation methods such as molecular beam epitaxy or flash evaporation or by CVD, a specific chemical vapor deposition method using hydrogen as a carrier gas has been developed which is particularly suited for production of polycrystalline p-type indium phosphide.

BRIEF DESCRIPTION OF THE DRAWINGS

Further advantage of the invention will become apparent from the following detailed description taken together with the drawings in which:

FIG. 1 is an illustration of a single crystal photovoltaic cell of the invention;

FIG. 2 is an illustration of a chemical vapor deposition apparatus useful in producing doped indium phosphide films;

DETAILED DESCRIPTION

Figure 4:
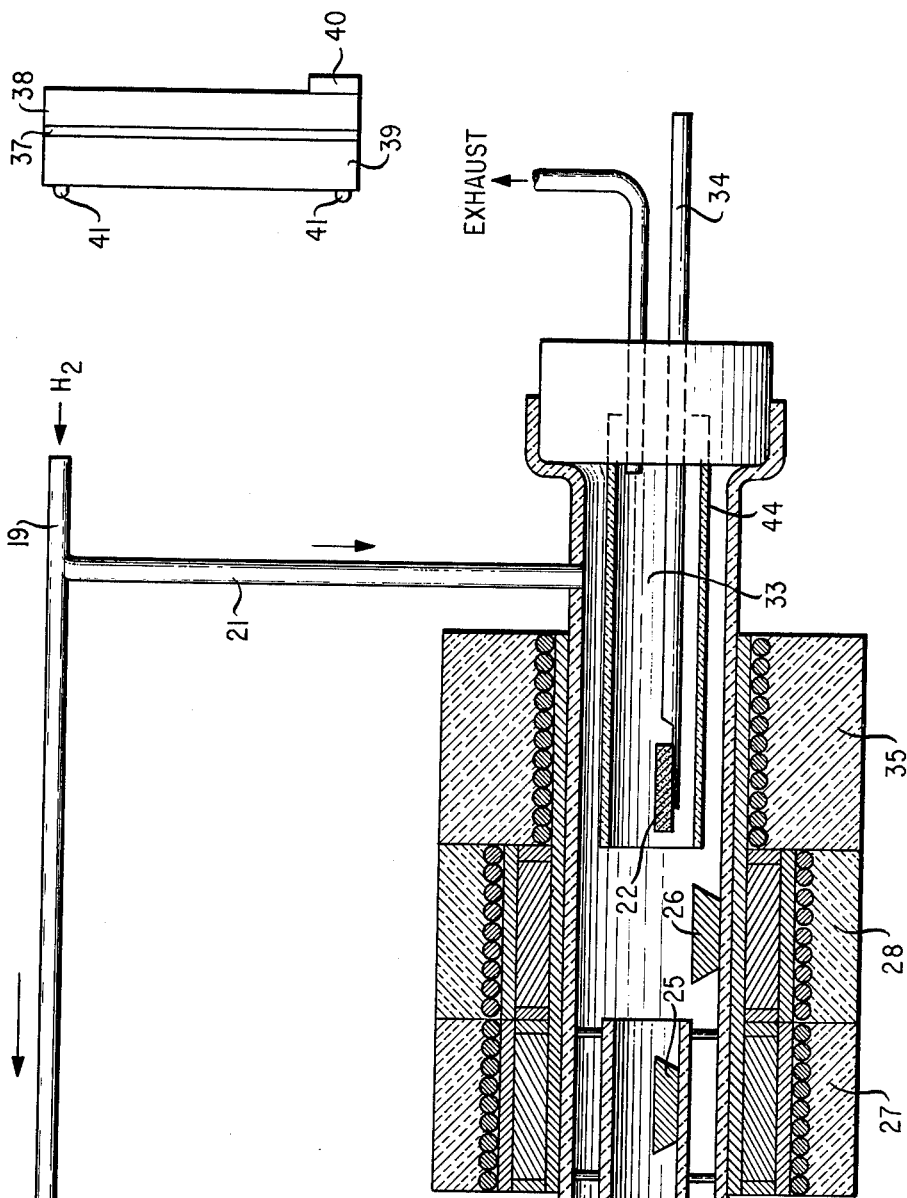
FIG. 4 is an illustration of a polycrystalline photovoltaic cell of the invention.

Preparation of Heterodiodes e.g., Solar Cells and Photodetectors Utilizing Single Crystal InP InP crystals are grown by the liquid encapsulant technique. See J. B. Mullin et al., Conference Series Number 9, Inst. Of Physics, London and Bristol 1971, 141–49; Bachmann, *J. Electronic Mater.,* 4, 389–406 (1975). Cd or Zn is added as an acceptor impurity to achieve controlled p-type conductivity. The single crystalline ingot is oriented for cutting (111) plane wafers. After cutting, the 111 plane is etched in cold concentrated hydrochloric acid for twenty seconds. As a result of this treatment the A (or In) face of the 111 plane will appear shiny and the B (or P) face will appear dull. Either face can be used, but the A face yields a better solar energy conversion efficiency. Whichever face is to be used is then mechanically polished, for example, with a final Syton polish (a trademark representing an alkaline silica sol). The p-type InP portion 11 (FIG. 1) of the heterodiodes had ~ 2 Ω-cm resistivity. The "back" contact 12 to the InP side of the final diode can be applied before or after growing the n-type CdS layer 13. When contact 12 is applied before, the Syton polished face is embedded in wax, and three films, i.e., Au, Zn and Au are successively electrodeposited on the InP. After removal of the wax, and boiling first in acetone, then in methanol, the metallic contact 12 is annealed for ~ 5 min. at 475° in forming gas.

When no contact 12 is applied to the InP wafer 11 before the CdS layer 13 growth, the wafer 11 is cleaned after the Syton polishing by boiling in acetone and then in methanol. The InP wafers 11, with or without contact, are now ready for CdS growth. They are immediately mounted, in a laminar flow hood on a substrate holder which is then transferred to the CdS growth station. The mechanically polished InP wafers 11 which had been slightly etched in cold HCl before a final methanol rinse have also been used.

The apparatus for CdS growth is a modification of an apparatus previously described by D. Beecham in *Rev. Sci. Instrum.*, 41, 1654 (1970). The device, as modified, has been described by S. Wagner in two articles, *Applied Physics Letters*, 22, 351 (1973) and *J. Applied Physics*, 45, 246 (1974). These publications basically disclose a coaxial isothermal double source for in vacuo growth of CdS from cadmium and sulfur. A single heating element, comprising a concentric nichrome or tantalum wire wound on a quartz tube, controls both the cadmium and sulfur temperature. The respective fluxes of cadmium and sulfur are controlled by separate effusion orifices. The source is positioned in an oil free vacuum system and is separated from the substrate holder by a mechanically operated stainless steel shutter. After mounting the InP substrate holder in the apparatus the vacuum station used for growth of CdS films 13 is closed and evacuated to a pressure $< 1 \times 10^{-5}$ Torr. The coaxial isothermal CdS source (not shown), which contains elemental cadmium and elemental sulfur, is then heated to 350° C. Simultaneously the InP substrate holder is heated to 200°–250° C. During the heat-up, the stainless steel shutter remains closed and separates the source compartment from the substrate.

When source and substrate have reached the set temperature, the shutter is opened and a 5 to 10μm thick n-CdS film 13 is grown on the p-InP wafer 11. The rate of film growth is monitored with a quartz crystal oscillator. It is about 0.15 μm/min. When the desired film thickness has been reached the shutter is closed and both the source and the substrate heaters are turned off. The substrate holder is allowed to cool to room temperature, the vacuum station is filled with nitrogen, opened, and the samples are removed. When the Au/Zn/Au contact 12 to the InP has been made prior to CdS growth, this contact 12 is now slightly buffed, and attached with silver paste 14 to a copper block 15. Samples 11, 13 without Au/Zn/Au contact 12 are waxed with the CdS layer 13 down. Then the contact 12 is made by electroplating, and is sintered as described earlier. Again, the InP wafer 11 is mounted on a copper block 15 by means of silver paint 14. On the CdS surface, a contact grid 16 of indium metal is applied.

A schematic drawing of the diode—usable as a photodetector or solar cell—thus completed is shown in FIG. 1. This device has a quantum efficiency of 70% and solar conversion efficiency of 10.3% when the A face is used and 8.5% when the B face is used as measured using as a source a solar light simulator consisting of a W-Halogen lamp at 3200 K and a KG-2 filter giving an incident power density of 83 mw/cm².

It should be recognized that the above-described configuration for an InP/CdS photovoltaic cell is merely exemplary of a number of possible structures. Certain details can be changed to enhance the commercial desirability of the device. For example, an antireflection coating such as a film of silicon monoxide can be added to the transmission surface of the CdS layer 13, i.e., to the surface of the CdS layer upon which the incident light is to be directed (in which case the quantum efficiency and solar conversion are respectively 0.95 and 14% in cells built on the A face); or a glass substrate capable of supporting the device can be added to the exterior of the CdS layer 13 and the Cu block 15 can then easily be replaced by a soldered contact such as indium. Further in another configuration, the Cu block 15 can be replaced by another conducting material whose surface is, for example, molybdenum, carbon, zincated conducting metal or any other corrosion resistant metal.

In any of the aforementioned configurations the solar light impinges on the transmission surface and is transmitted through the n-type cadmium sulfide layer before contacting the InP crystal. In this manner charge carriers are formed in the CdS only by light quanta in the range above 2.42 ev (which is the conduction band gap for CdS) and the bulk of the charge carriers are formed in the InP layer by light in the 1.34 ev to 2.42 ev range (1.34 ev is the conduction band gap for InP). Since InP is a direct gap material it has a large absorption coefficient. Thus, most of the charge carriers are formed in proximity to the interface of the heterojunction. This result decreases the probability of carrier recombination and, in turn, increases the efficiency of the cell.

Additionally, a device can be built on a CdS single crystal by depositing a layer of p-type InP on a face of the crystal. This can be done, for example, through the use of molecular beam epitaxy. Then if a grid electrode is added to the InP and if an electrical contact is attached to the CdS, light can be shined directly on the thin InP layer. Because of the high absorption coefficient of InP a very thin layer can be utilized to ensure that charge carrier formation will still occur near the interface.

Preparation of Heterojunctions e.g., Solar Cells and Photodetectors Utilizing Polycrystalline InP Films of p-type indium phosphide can be deposited on various substrates by employing conventional techniques, e.g., evaporation methods (flash evaporation or molecular beam epitaxy) or by utilizing a chemical vapor deposition (CVD) process using phosphorus trichloride, or triethyl indium and phosphine as the source compounds. It has been discovered that a specific CVD process employing $PCl_3$ saturated hydrogen gas or phosphine and hydrogen chloride saturated hydrogen gas give films quite suitable for photovoltaic purposes.

Figure 3:
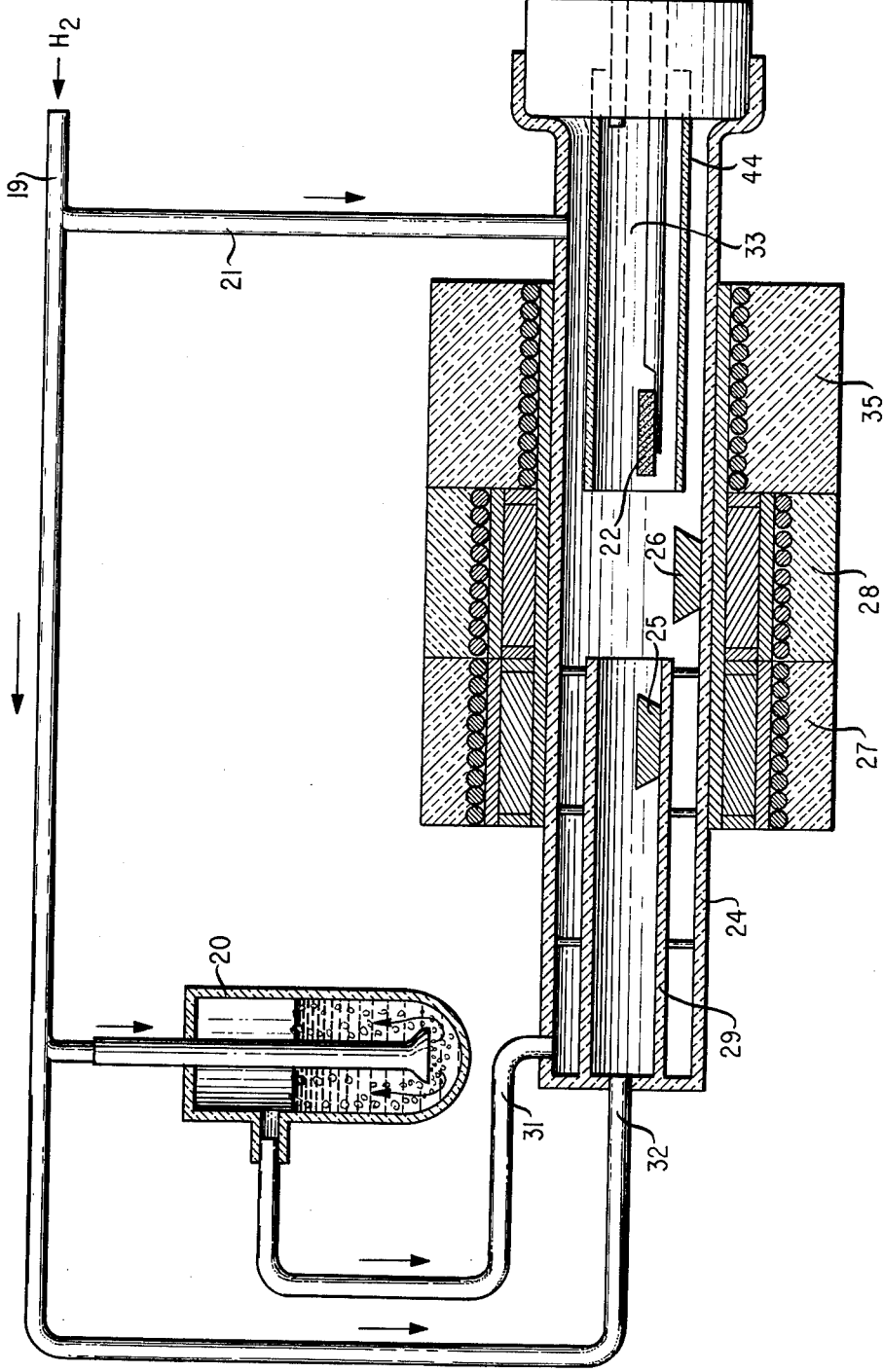
FIG. 3 is an illustration of a modified chemical vapor apparatus useful in producing doped indium phosphide films.

Specifically, the apparatus shown in FIG. 2 can be used to manufacture p-type InP films for polycrystalline heterojunction devices. A stream of hydrogen gas which has been purified by diffusion through palladium is introduced into tube 19 and passes through a bubbler 20 containing phosphorus trichloride held at a constant temperature typically in the range between 0° and 5° C. (A portion of the pure palladium diffused hydrogen also is diverted through 21 where it passes on the outside of tube 44). The hydrogen gas which is in the bubbler becomes saturated with phosphorous trichloride. The bubbler temperature, the flow rate of $H_2$ through the bubbler, and the total flow rate of $H_2$ are adjusted so that the molar fraction of $PCl_3$ in the $H_2$ is between 1 and 5%, preferably 2%. The $PCl_3$ saturated hydrogen gas is then flowed through a conduit 23 into quartz tube 24 which contains boats 25 and 26. The linear velocity of the hydrogen stream can vary over a large range of velocities between 10 and 50 cm/min. preferably 30 cm/min., but higher flow rates are usable. The boats 25 and 26 are independently heated by furnaces 27 and 28 and contain respectively a dopant composition and elemental indium. The dopant compound can most advantageously be anhydrous cadmium chloride. Elemental cadmium if used in the configuration of FIG. 2 will be converted to $CdCl_2$ by the $PCl_3$ saturated hydrogen gas. However, if elemental Cd or Zn is desired as a dopant, the apparatus of FIG. 2 may be modified to achieve this result as shown in FIG. 3. This modification can be accomplished as shown in FIG. 3 by placing the dopant in an extra quartz tube 29 which is concentric to the main deposition tube and which ends shortly before the location of the In source boat 26. Separate inlets 31 and 32 are provided for the two concentric quartz tubes. Only purified hydrogen gas is flowed through inlet 32 to the dopant. The $PCl_3$ saturated hydrogen is injected through inlet 32. The two gas flows are adjusted so that the $PCl_3$ molar fraction is set as previously discussed.

In the practice of the invention the boat 25 containing preferably elemental cadmium is preheated and maintained between 450° and 550° C, preferably between 470° and 480° C. If anhydrous cadmium chloride is used, the preferred temperature is 500° C and if elemental Zn is used, a range of 550°–600° C preferably 580° C is appropriate. The indium in boat 26 is preheated and maintained between 700° and 800° C, preferably 740° C. Once boats 25 and 26 have been preheated and a steady state flow of $PCl_3$ saturated hydrogen is established, the substrate 22 is pushed in the deposition area 33 in tube 44, using rod 34, where it is heated and maintained between 575° C and 700° C, preferably 630° C by an independently controlled furnace 35.

As the $PCl_3$ saturated hydrogen flows over the indium containing boat, it reacts with the indium forming a crust of InP on the surface of the indium. The further reaction of the $PCl_3$ with the InP crust causes indium monochloride to be carried in the $PCl_3$ saturated hydrogen flow downstream and is mixed with the $H_2$ stream containing the dopant, then carried downstream where Cd doped InP is deposited on the substrate. The deposition process can be continued until the desired thickness of p-type InP is obtained. Since an indium phosphide crust is initially formed, it is also possible to use initially in the boat indium phosphide instead of elemental indium. In such a case the same conditions are used. The rate of deposition can be varied between 1 and 20 $\mu$m/hr. by controlling the temperature difference between the In source and the substrate. Layers between 1$\mu$ and 25$\mu$ have been produced. Layers larger than 25$\mu$ can be produced using this method by simply extending the deposition time. Since the absorption length of InP is 1$\mu$m, layers thinner than this are undesirable if best efficiency is to be obtained.

The carrier system of $PCl_3$ saturated hydrogen gas can also be replaced by a hydrogen-phosphine-hydrogen-chloride gas system (HPA system). When this system is used, the $PCl_3$ bubbler is replaced by a source of HCl and phosphine gas such as a cylinder containing a mixture of HCl gas in hydrogen and a cylinder containing a mixture of $PH_3$ in hydrogen. The compositions of these gas mixtures are not critical but mole ratios of 10% of HCl to $H_2$ and 5% $PH_3$ to $H_2$ have been found convenient for controlling the flows of HCl and $PH_3$ into tube 24, FIG. 2. The $PCl_3/H_2$ mixture described previously reacts inside the heated tube 24, FIG. 2 to form HCl, and phosphorus molecules such as $P_2$ and $P_4$. The same chemical composition of the vapor phase is achieved when HCl, $PH_3$ and $H_2$ are injected instead of the $PCl_3/H_2$ mixture. The process parameters can remain as described for the CVD process using $PCl_3/H_2$. The mole ratio of HCl and $PH_3$ and $H_2$ is controlled to be equivalent to the ratios of $PCl_3$ to $H_2$ outlined previously. Thus, it can been seen that a carrier system containing both HCl and phosphorus molecules is the desired result.

The substrate is composed of materials whose coefficient of expansion substantially matches that of InP and which do not react with InP at temperatures below 650° C, for example, Corning 7052 glass (a tradename for a low alkali, barium alumina borosilicate composition), Nonex glass (a tradename for a hard borosilicate glass), carbon molybdenum, and canary glass. Before use, the glass substrates are cleaned by polishing in a hydrogen flame. The molybdenum substrates are cleaned by etching for 30 sec. in a mixture of 50 ml. concentrated nitric acid and 30 drops of hydrofluoric acid, followed by washing with distilled water and propanol. Both the carbon and molybdenum substrates receive a final step of heating at 1000° C in vacuum. No cracking or peeling was observed for films on the aforementioned substrate materials.

The acceptor concentration obtained by the practice of the inventive CVD process is between $10^{16}$ and $10^{20}$ cm$^{-3}$. This is within a range which produces semiconductor material which is quite satisfactory for use in photovoltaic cells. Also the average crystal size of the particles forming the layer was approximately 2$\mu$m. This is significant. If the grain size was substantially smaller it would closely approach the absorption length p-type indium phosphide. Therefore, most charge carriers would necessarily have to cross at least one crystal boundary. This, in turn, would lead to excessive recombination and reduced efficiency. Nevertheless, by the practice of the process very thin layers having a 2$\mu$m or larger grain size can be produced. This combination helps maximize efficiency while minimizing the amount of material which must be used.

Once the p-type InP layer 37 as shown in FIG. 4 has been formed on, for example, a carbon substrate 38, either by the CVD process of this invention or by another CVD process or another technique such as evaporation, the surface which is to be used as an interface surface is treated for 15 seconds in a cold bromine-methanol solution (0.1% by volume bromine) and then rinsed in pure methanol. Then a layer of n-type CdS 39 is deposited on the p-type InP layer by the method previously described in connection with the single crystal embodiments. The thickness of the CdS layer is not critical and can be typically 10$\mu$m. Although it is not essential, the cell can be annealed in forming gas. Electrical contact to the InP side of the heterojunction can be made in many ways, for example, by attaching a copper tab 40 to the carbon substrate. Contact to the CdS side can also be done by various means, for example, by using conventional techniques to add a thin In or Ga-In alloy contact 41 to a portion of the exterior of the CdS material 39. Either a corner of the CdS surface can be covered or a grid over the entire CdS surface can be used. Typically the In or Ga-In alloy covers 0.1% of the CdS surface area. The cell as depicted in FIG. 3 can then be operated by directing the solar energy through the transmissive CdS layer and into the InP layer. Since InP has a large absorption coefficient, charge carriers are formed near the interface. This results in a quantum efficiency of 70% and solar conversion efficiency of 2.5% as measured using a solar light simulator as a source.

The above configuration, however, is only exemplary of the possible cell geometries. As with the single crystal devices, many cell configurations are also possible in the polycrystalline cells. Either a glass protective cover or an antireflection coating can be added on top of the In or Ga-In contact. The solar energy is directed through the CdS layer to form charge carriers near the interface. Various substrates such as molybdenum or zincated metal can be employed instead of carbon. (However, if zincated metal is used the CVD method disclosed herein may require some additional precautions since the HCl formed in that method attacks the zinc).

A cell can also be built by depositing a polycrystalline layer of n-type CdS on a glass plate which has a conducting grid on its surface. This grid can be formed, for example, by simply brushing a thin layer of In on the surface of the glass. The CdS layer can be formed by techniques such as CVD or by using the isothermal source described previously. A thin layer of p-type InP is then deposited on the CdS by processes such as CVD or molecular beam epitaxy. The InP layer can be approximately 2$\mu$m thick, while the CdS layer may be much thicker e.g., 10 to 20$\mu$m. An opaque metallic electrical contact can then be attached to the exposed surface of the InP by standard techniques such as electroplating or evaporation.

Thermal Stability of the CdS Layer

It has also been found that the thermal stability in air of the n-type CdS layer of the device is strongly affected by the net donor concentration in the layer. A net donor concentration in the n-type CdS of at least 5 $\times$ $10^{18}$cm$^{-3}$ produces an increase in thermal stability in air when compared to devices with net donor levels of approximately 2 $\times$ $10^{18}$cm$^{-3}$ and lower.

For testing, devices with high net donor levels (single crystal and polycrystalline) were made as described before using the isothermal source. However, to obtain the higher net donor levels the source temperature was raised from 350° to 375° C. The orifice areas for the Cd source and S source respectively were 0.47cm$^2$ and 0.4 $\times$ $10^{-4}$cm$^2$. The InP substrates were kept at 240° C. Under such conditions net donor concentrations between 5 $\times$ $10^{18}$ and 1 $\times$ $10^{19}$cm$^{-3}$ were produced.

An exemplary single crystal P-InP/n-CdS device had a 10$\mu$m thick n-type cadmium sulfide layer. The properties of the CdS layer of this device were investigated by Hall measurements (See van der Pauw, L. J., *Philips Technical Review* 20, 220 (1958)). The CdS layer had a resistivity of 0.0063$\Omega$-cm, and a net donor concentration of 7.1 $\times$ $10^{18}$cm$^{-3}$. After 7 days at 485° C in air, the resistivity of the n-type CdS increased to only 0.04$\Omega$-cm. Under similar temperature conditions a device with a single crystal n-CdS layer having a net donor concentration of 2 $\times$ $10^{18}$cm$^{-3}$ showed a resistivity increase from 0.019$\Omega$-cm to 2$\Omega$ in only 15 minutes.

An exemplary polycrystalline pInP/nCdS device with a n-CdS layer having a net donor concentration of approximately 1 $\times$ $10^{19}$cm$^{-3}$ also showed good stability, i.e., stability up to 600° C for 15 min. anneals in air.

The good stability of the n-CdS layer is not dependent as such on the use of a p-type InP semiconductor layer. Thus, n-type CdS with a high net donor concentration can have useful application with other p-type semiconductor material provided no degenerating interdiffusion or chemical reaction of the two semiconductor materials occur.

What is claimed is:

1. A photovoltaic cell comprising a region of n-type semiconductor material, a surface of which is in intimate contact with a surface of a region of p-type semiconductor material, wherein said region of n-type semiconductor material and said region of p-type semiconductor material are each in conductive contact with a respective electrode structure, said photovoltaic cell characterized in that said n-type semiconductor material is n-type CdS and said p-type semiconductor material is p-type InP, with the proviso that said n-type semiconductor material is a single crystal whenever said p-type semiconductor material is a single crystal.

2. The photovoltaic cell of claim 1 including an antireflection layer on another surface of said CdS forming a transmission surface.

3. The photovoltaic cell of claim 1 wherein said p-type InP is a single crystal.

4. The photovoltaic cell of claim 1 wherein said p-type InP is polycrystalline.

5. The photovoltaic cell of claim 1 including a supporting substrate wherein said substrate can function as one of said electrode structures.

6. The photovoltaic cell of claim 5 wherein said supporting structure is composed of a material transparent to light.

7. The photovoltaic cell of claim 6 wherein said material transparent to light is glass.

8. The photovoltaic cell of claim 5 wherein said supporting substrate is a conducting substrate which makes conductive contact to said p-type semiconductor material and wherein an electrode structure which transmits light is in conductive contact with said n-type semiconductor material.

9. The photovoltaic cell of claim 8 wherein the p-type InP is polycrystalline.

10. The photovoltaic cell of claim 8 wherein said supporting substrate is composed of a material selected from the group consisting essentially of molybdenum and carbon.

11. The photovoltaic cell of claim 10 wherein said p-type InP is formed by means of a chemical vapor deposition process.

12. The photovoltaic cell of claim 5 wherein said p-type semiconductor material is a single crystal.

13. The photovoltaic cell of claim 5 wherein said p-type semiconductor material is polycrystalline.

14. The photovoltaic cell of claim 1 wherein said region of p-type semiconductor material is formed by means of a process comprising the steps of (1) flowing hydrogen gas in proximity to a source of dopant said dopant being selected from the class consisting essentially of cadmium and zinc wherein said source is heated to a temperature between 450° and 550° C in the case of cadmium and 550° to 600° C in the case of zinc (2)

flowing hydrogen gas to proximity to an indium containing material selected from the group consisting essentially of elemental indium and indium phosphide held at a temperature between 700° and 800° C (3) then passing the hydrogen gas from steps (1) and (2) in proximity to a substrate which is held between 575° and 700° C, wherein said hydrogen gas from step (2) contains a carrier mixture comprising hydrogen chloride and molecular phosphorus and wherein the hydrogen gas of step 1 may also contain said carrier mixture.

15. The photovoltaic cell of claim 14 wherein said carrier mixture is obtained by adding phosphorus trichloride to hydrogen gas and wherein the molar fraction of phosphorus trichloride to total hydrogen from steps (1) and (2) is between 1 and 5%.

16. The photovoltaic cell of claim 14 wherein said substrate has a surface composed of material selected from the group consisting essentially of glass, graphite, and molybdenum.

17. The photovoltaic cell of claim 14 wherein said source of dopant is elemental cadmium.

18. The photovoltaic cell of claim 17 wherein said elemental cadmium is held between 470° C to 480° C.

19. The photovoltaic cell of claim 14 wherein said source of dopant consists essentially of anhydrous cadmium dichloride.

20. The photovoltaic cell of claim 19 wherein said anhydrous cadmium dichloride is held at approximately 500° C.

21. The photovoltaic cell of claim 14 wherein said indium containing material is held at approximately 750° C.

22. The photovoltaic cell of claim 14 wherein said source of dopant is elemental zinc.

23. The photovoltaic cell of claim 1 wherein the net donor concentration of said n-type CdS is above $5 \times 10^{18} cm^{-3}$.

24. The photovoltaic cell of claim 1 wherein said n-type CdS is polycrystalline and the net donor concentration in said n-type CdS is at least $5 \times 10^{18} cm^{-3}$.

25. A solar cell comprising a supporting electrode structure of zincated conducting metal, a solar-energy absorbing body of p-type indium phosphide disposed on said electrode structure, a heterojunction-forming and solar-energy transmitting window of n-type cadmium sulfide deposited on said indium phosphide p-type body, and a partially-transmissive electrode structure deposited on said cadmium sulfide, with the proviso that said n-type semiconductor material is a single crystal whenever said p-type semiconductor material is a single crystal.

26. The solar cell of claim 25 wherein a protective transparent body overlies said cadmium sulfide and said transmissive electrode structure.

27. A solar cell according to claim 26 in which the supporting electrode is a zincated metal sheet, the heterojunction-forming n-type cadmium sulfide is a polycrystalline layer forming a heterojunction with the p-type InP body said body being a polycrystalline body.

28. A photodetector comprising a polycrystalline or single crystal p-type body of indium phosphide, a heterojunction-forming and partially transmissive window of polycrystalline or single crystal n-type cadmium sulfide deposited on said p-type body, a partially transmissive electrode structure deposited on said n-type cadmium sulfide window, and means for establishing conductive contact to the remote surface of the p-type body, with the proviso that said n-type semiconductor material is a single crystal whenever said p-type semiconductor region is a single crystal.

29. A photodetector according to claim 28 in which the means for establishing conductive contact comprises a film-like metal alloy contact disposed on the p-type indium phosphide body, a silver paste thereover and a conductive heat-sinking-type contact disposed on said silver paste.

* * * * *